(12) United States Patent    (10) Patent No.: US 8,248,184 B2
Furutani    (45) Date of Patent: Aug. 21, 2012

(54) DUPLEXER MODULE

(75) Inventor: Koji Furutani, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/192,499

(22) Filed: Jul. 28, 2011

(65) Prior Publication Data

US 2011/0279194 A1    Nov. 17, 2011

Related U.S. Application Data

(63) Continuation of application No. PCT/JP2010/050906, filed on Jan. 25, 2010.

(30) Foreign Application Priority Data

Jan. 29, 2009    (JP) .................................. 2009-018606

(51) Int. Cl.
  *H03H 7/46* (2006.01)
  *H01P 5/12* (2006.01)
(52) U.S. Cl. ...................... 333/132; 333/126; 333/129
(58) Field of Classification Search .......... 333/126–129, 333/132, 134
  See application file for complete search history.

(56) References Cited

U.S. PATENT DOCUMENTS

| 7,747,227 | B2 * | 6/2010 | Fukuda .......................... 455/91 |
| 7,855,983 | B2 * | 12/2010 | Knecht et al. ................. 370/280 |
| 2003/0171098 | A1 | 9/2003 | Tai et al. |

FOREIGN PATENT DOCUMENTS

| CN | 201583609 | * | 9/2010 |
| JP | 09-270619 A | | 10/1997 |
| JP | 2005-269564 A | | 9/2005 |
| WO | 02/17504 A1 | | 2/2002 |

OTHER PUBLICATIONS

Official Communication issued in International Patent Application No. PCT/JP2010/050906, mailed on Mar. 16, 2010.

* cited by examiner

*Primary Examiner* — Robert Pascal
*Assistant Examiner* — Kimberly Glenn
(74) *Attorney, Agent, or Firm* — Keating & Bennett, LLP

(57) ABSTRACT

In a duplexer module, a transmitting signal is correctly monitored without deteriorating receiving sensitivity. The duplexer module includes a transmission line, a reception line, and an antenna common line, and performs conversion between a transmission signal and a reception signals and antenna common signals. A transmission filter is inserted into the transmission line, and the transmission filter allows the transmission signal to pass therethrough and stops the reception signal. A reception filter is inserted into the reception line, and the reception filter allows the reception signal to pass therethrough and stops the transmission signal. A first line of a coupler which detects the transmitting signal is inserted into the transmission line at a stage subsequent to the transmission filter.

9 Claims, 3 Drawing Sheets

DUPLEXER MODULE

BACKGROUND OF THE INVENTION

1. Field of the Invention

The present invention relates to a duplexer module in which a monitoring element used to monitor a transmission output is connected to a duplexer provided on a multilayer substrate or a printed substrate.

2. Description of the Related Art

For a front-end portion of a cellular phone or the like, a duplexer is adopted that performs conversion between a reception signal and a transmission signal and antenna common signals. In recent years, as duplexers, discrete components have been adopted, each of which includes an integrated combination of a transmission filter, a reception filter, and a phase adjustment circuit, and the duplexer thereof is mounted on a substrate, thereby configuring a duplexer module. In some cases, in the duplexer module, a coupler is inserted into an antenna common line connected to an antenna common terminal of the duplexer, and a portion of the electrical power of a transmission signal is transmitted to a monitoring line, thereby monitoring a transmission output (for example, refer to Japanese Unexamined Patent Application Publication No. 09-270619).

In the above-mentioned duplexer module, owing to the insertion loss of the coupler inserted into the antenna common line, the receiving sensitivity of a reception signal is deteriorated. In addition, the isolation of the monitoring line for a reception line is deteriorated, and isolation between a transmission line and the reception line is also deteriorated. Accordingly, it may be considered that a coupler is inserted into the transmission line connected to a transmission signal terminal of the duplexer. However, in that case, an influence such as the insertion loss of the duplexer itself or the like is not included in a signal detected in the coupler at that position, and it is difficult to correctly monitor the transmission signal.

SUMMARY OF THE INVENTION

Therefore, preferred embodiments of the present invention provide a duplexer module in which a transmission signal can be correctly monitored without deteriorating receiving sensitivity or isolation.

According to a preferred embodiment of the present invention, a duplexer module that performs conversion between a transmission signal and a reception signal and antenna common signals, includes a transmission line, a reception line, an antenna common line, and a monitoring line. A transmission filter is inserted into the transmission line. The transmission filter allows the transmission signal to pass therethrough. A reception filter is inserted into the reception line. The reception filter allows the reception signal to pass therethrough. The antenna common line is connected to the transmission line and the reception line through a connection portion, and the antenna common signal passes therethrough. A portion of the electrical power of the transmission signal passes through the monitoring line. A monitoring element used to transmit a portion of the electrical power of the transmission signal to the monitoring line is inserted between the transmission filter and the connection portion.

In this configuration, the monitoring element is inserted into the transmission line, and no insertion loss of the monitoring element occurs in the antenna common line and the reception line, through which the reception signal passes. In addition, isolation rises between the monitoring line and the reception line. Furthermore, the monitoring element is inserted on a side nearer the antenna common line in relation to the transmission filter, in the transmission line, and it is possible to monitor the transmission signal subjected to the influence of an insertion loss due to the transmission filter.

In the duplexer module according to a preferred embodiment of the present invention, phase adjustment circuits used to adjust the phases of the transmission signal and the reception signal may be disposed between the connection portion and the transmission filter and between the connection portion and the reception filter.

The monitoring element according to a preferred embodiment of the present invention may be a coupler that couples the monitoring line and the transmission line with each other. As the monitoring element, an isolator or the like may be adopted in addition to the coupler.

The coupler according to a preferred embodiment of the present invention includes first and second lines that are isolated from each other and coupled with each other, and it is preferable that the first line configures at least a portion of the phase adjustment circuit and the second line is inserted into the monitoring line and transmits a portion of the electrical power of the transmission signal to the monitoring line. While usually the duplexer includes a transmission filter, a reception filter, and a phase adjustment circuit, the first line of the coupler is caused to have a phase adjustment function, and hence it is possible to save a phase adjustment circuit and to reduce the insertion loss thereof. In addition, by saving the phase adjustment circuit, it is also possible to promote the downsizing of a module size.

The duplexer module according to a preferred embodiment of the present invention includes a substrate including a main surface that has a rectangular or substantially rectangular shape and a plurality of mount electrodes disposed along an outer edge of a mounting surface of the substrate, and it is preferable that a mount electrode connected to one end portion of the transmission line and a mount electrode connected to one end portion of the reception line are individually disposed along different sides of the outer edge. If a mount electrode influencing the reception signal and a mount electrode influencing the transmission signal are located near each other, a problem that isolation between lines is reduced occurs. Therefore, in a preferred embodiment of the present invention, it is possible to improve the isolation by disposing these mount electrodes on the different sides of the outer edge.

It is preferable that, in the duplexer module according to a preferred embodiment of the present invention, a mount electrode connected to one end portion of the monitoring line and a mount electrode connected to one end portion of the reception line or one end portion of the transmission line are individually disposed along different sides of the outer edge. If these mount electrodes are located near each other, a problem that isolation between lines is reduced occurs. Therefore, in a preferred embodiment of the present invention, it is possible to improve the isolation by disposing these mount electrodes on the different sides of the outer edge.

The transmission filter, the reception filter, and the coupler are mounted on surface electrodes disposed on a second main surface facing the first main surface of the substrate, and a surface electrode on which one end portion of the first line of the coupler is mounted may be connected to the connection portion through at least one of a pattern electrode and a via hole filled with a conductive material, provided in the substrate.

The transmission filter and the reception filter of a preferred embodiment of the present invention are preferably integrated into a discrete component, and may include a terminal pair connected to the monitoring element. Accordingly, even if a filter having an integral structure is used, it is possible to insert the monitoring element.

According to preferred embodiments of the present invention, since the monitoring element is inserted into the transmission line, and no insertion loss of the monitoring element occurs in the antenna common line and the reception line, through which the reception signal passes, it is possible to improve receiving sensitivity. In addition, since the monitoring element is inserted on a side nearer the antenna common line in relation to the transmission filter, in the transmission line, it is possible to correctly monitor the transmission signal in which an insertion loss due to the transmission filter occurs.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
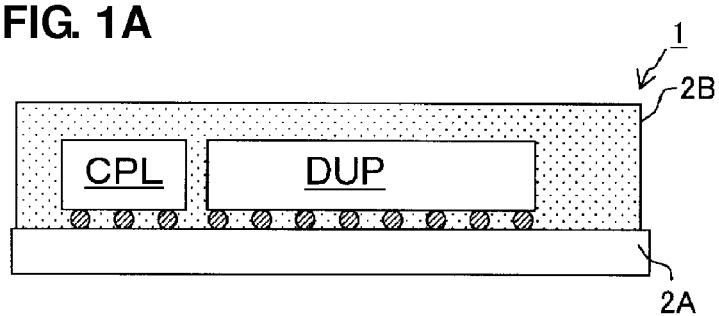
FIGS. 1A-1C are diagrams illustrating an example of a configuration of a duplexer module according to a first preferred embodiment of the present invention.
Figure 1B:
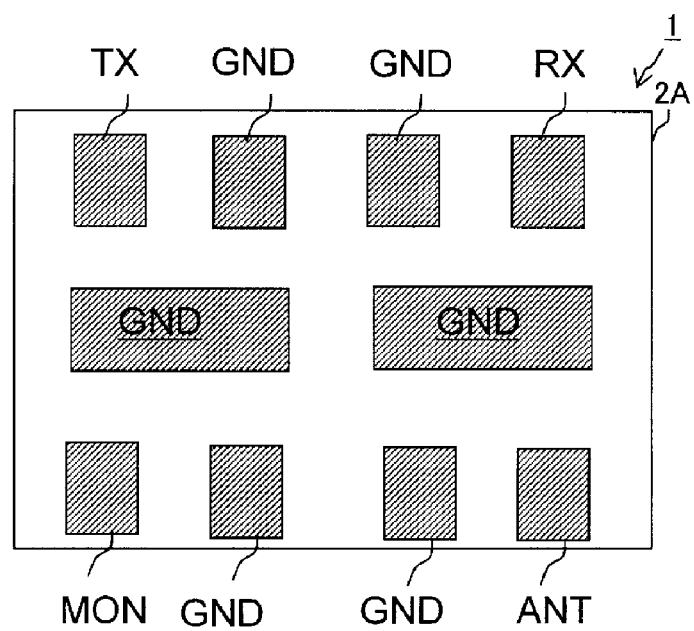
Figure 1C:
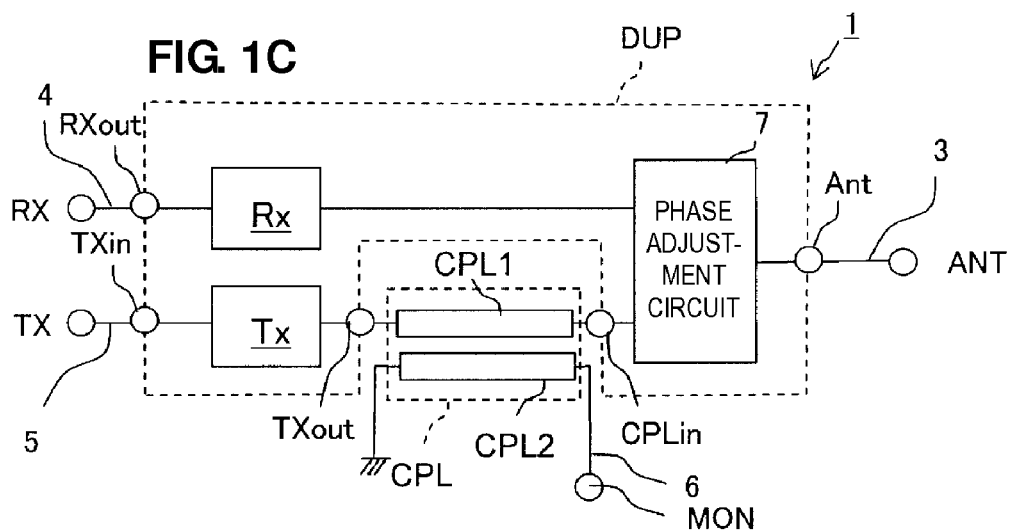

FIGS. 1A-1C are diagrams illustrating an example of the configuration of a duplexer module according to a first preferred embodiment of the present invention. FIG. 1A is a side cross-sectional view of a duplexer module 1, FIG. 1B is a bottom view of the duplexer module 1, and FIG. 1C is a schematic equivalent circuit diagram of the duplexer module.

The duplexer module 1 includes a printed substrate 2A, a resin mold 2B, a duplexer DUP, and a coupler CPL. A bottom surface that is one main surface of the printed substrate 2A is a module mounting surface including mount electrodes. Each of the mount electrodes is used as one of a ground port GND, a transmission port TX, a reception port RX, an antenna port ANT, and a monitoring port MON that are external connecting ports of the duplexer module 1. A top end surface that is the other main surface of the printed substrate 2A is a chip mounting surface including a plurality of surface electrodes (not illustrated), and mounts thereon the duplexer DUP and the coupler CPL that are discrete components. The duplexer DUP is configured by integrating a surface-elastic-wave-type transmission filter and a surface-elastic-wave-type reception filter onto a piezoelectric substrate. The duplexer DUP includes an antenna common terminal Ant, a reception output terminal RXout, a transmission input terminal TXin, a transmission output terminal TXout, and a coupler input terminal CPLin, which are illustrated as connection terminals in the equivalent circuit diagram, and these terminals are connected to the surface electrodes of the printed substrate 2A using solder or the like. The coupler CPL is an irreversible circuit and transmits a transmission signal in only one direction, and a monitoring line 6 is weakly coupled to a transmission line 5. Connections between the surface electrodes and the mount electrodes in the printed substrate 2A are established using via holes. The duplexer DUP and the coupler CPL are molded onto the printed substrate 2A using the resin mold 2B.

In the present preferred embodiment, from among mount electrodes provided on the mounting surface of the printed substrate 2A, individual mount electrodes defining the transmission port TX, the reception port RX, the antenna port ANT, and the monitoring port MON in the duplexer module are disposed so as to sandwich therebetween mount electrodes defining ground ports GND. Accordingly, isolation between the transmission signal and the reception signal is secured.

In an equivalent circuit, the duplexer module 1 includes an antenna common line 3, a reception line 4, a transmission line 5, and a monitoring line 6. In addition, as circuit elements located within the duplexer DUP, the duplexer module 1 includes a transmission filter Tx, a reception filter Rx, and a phase adjustment circuit 7, and includes a first line CPL1 and a second line CPL2, as circuit elements configuring the coupler CPL. The phase adjustment circuit 7 is configured so as to include a phase adjustment line on a transmission side and a phase adjustment line on a reception side, not illustrated.

The antenna common line 3 is a line that connects the phase adjustment circuit 7 and the antenna port ANT to each other and through which an antenna common signal passes, and the antenna common terminal Ant of the duplexer DUP is connected to the antenna common line 3.

The reception line 4 is a line that connects the phase adjustment circuit 7 and the reception port RX to each other and through which a reception signal passes, the reception filter Rx is inserted between the phase adjustment circuit 7 and the reception port RX, and the reception output terminal RXout of the duplexer DUP is connected to the reception line 4.

The transmission line 5 is a line that connects the transmission port TX and the phase adjustment circuit 7 to each other and through which a transmission signal passes. The transmission filter Tx and the first line CPL1 of the coupler CPL are inserted between the transmission port TX and the phase adjustment circuit 7, and the transmission input terminal TXin, the transmission output terminal TXout, and the coupler input terminal CPLin of the duplexer DUP are connected.

The monitoring line 6 is a line that connects the ground port GND and the monitoring port MON to each other and through which a portion of the transmission signal passes, and is configured so as to include the second line CPL2 of the coupler CPL.

The duplexer module 1 having such a circuit configuration performs conversion between the transmission signal and reception signal and the antenna common signals. The transmission filter Tx inserted into the transmission line 5 allows the transmission signal having a predetermined frequency bandwidth to pass therethrough. The reception filter Rx inserted into the reception line 4 allows the reception signal having a predetermined frequency bandwidth to pass therethrough. The phase adjustment circuit 7 adjusts the phases of the transmission signal and the reception signal, and coordinates matching between the both. In the coupler CPL, the first line CPL1 and the second line CPL2 are coupled to each other, and a portion of the electrical power of the transmission signal is transmitted to the monitoring line 6 and output from the monitoring port MON.

The first line CPL1 of the coupler CPL is inserted between the transmission filter Tx and the phase adjustment circuit 7 in the transmission line 5. Therefore, it is possible to output a portion of the electrical power of the transmission signal subjected to the influence of an insertion loss due to the transmission filter Tx, from the monitoring port MON.

Accordingly, on the basis of an output from the monitoring port MON, feedback control to compensate for the influence of the characteristic variation of the transmission filter Tx or the like can be implemented with a high degree of accuracy on a set substrate side connected to the outside of the duplexer module 1. In addition, since the coupler CPL is not inserted into the antenna common line 3 and the reception line 4, the reception signal does not receive the influence of the insertion loss of the coupler CPL, and it is possible to improve the receiving sensitivity of the duplexer module 1. In addition, since the coupler CPL is inserted into the transmission line 5, it is possible to enhance isolation between the monitoring line 6 and the reception line 4, compared with a case in which the coupler CPL is inserted into the antenna common line 3.

In addition, while, in the present preferred embodiment, an example of a configuration has been illustrated in which the printed substrate 2A is preferably adopted, a multilayer substrate may be adopted in place of the printed substrate. In addition, while an example of a configuration has been illustrated in which the coupler CPL that is a discrete component is preferably adopted, the coupler may be configured using a pattern electrode provided on the substrate or the like. In addition, as the monitoring element, an isolator may be adopted in place of the coupler. In addition, while an example of a configuration has been illustrated in which the duplexer DUP that is a discrete component is preferably adopted, each of the transmission filter and the reception filter may be configured as a single discrete component. In addition, a filter other than the surface elastic wave filter may be adopted. The present invention may be suitably implemented in any configuration if, in the configuration, a monitoring element is adopted at a stage subsequent to a transmission filter included in a duplexer in a transmission line.

Figure 2:
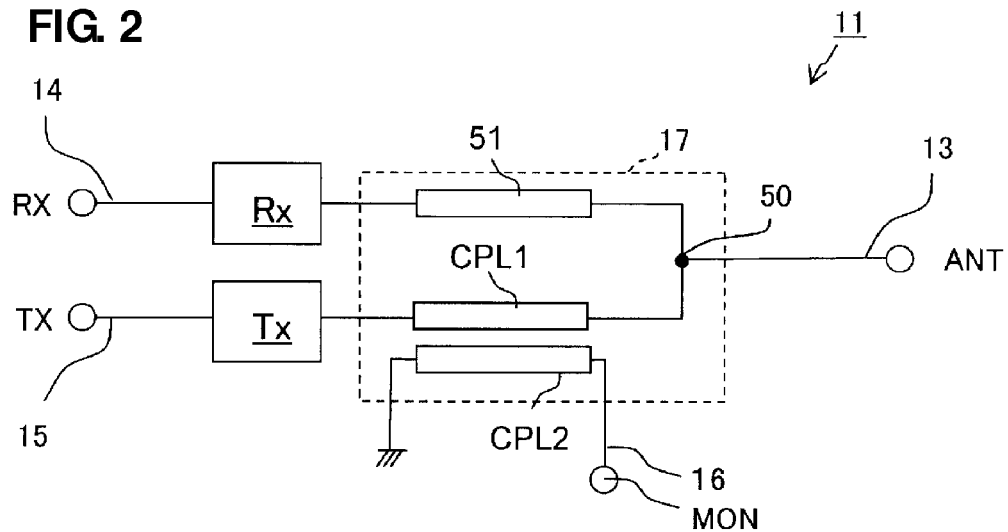
FIG. 2 is a diagram illustrating an example of a configuration of a duplexer module according to a second preferred embodiment of the present invention.

FIG. 2 is an equivalent circuit diagram illustrating an example of the configuration of a duplexer module according to a second preferred embodiment of the present invention.

A duplexer module 11 includes an antenna common line 13, a reception line 14, a transmission line 15, and a monitoring line 16. In addition, as circuit elements, the duplexer module 11 includes a transmission filter Tx, a reception filter Rx, and a phase adjustment-coupler circuit 17. The configuration of the equivalent circuit of the duplexer module 11 other than the phase adjustment-coupler circuit 17 is the same as that of the duplexer module 1 of the first preferred embodiment.

The antenna common line 13, the reception line 14, and the transmission line 15 are connected to one another using a connection portion 50. The antenna common line 13 connects the connection portion 50 and the antenna port ANT to each other, and an antenna common signal passes through the antenna common line 13. The reception line 14 connects the connection portion and the reception port RX to each other, and a reception signal passes through the reception line 14. The reception filter Rx and a phase adjustment line 51 on the reception side of the phase adjustment-coupler circuit 17 are inserted into the reception line 14. The transmission line 15 connects the connection portion 50 and the transmission port TX to each other, and a transmission signal passes through the transmission line 15. The transmission filter Tx and the first line CPL1 of the phase adjustment-coupler circuit 17 are inserted into the transmission line 15. The monitoring line 16 connects the ground port GND and the monitoring port MON to each other, and a portion of the transmission signal, used to monitor the transmission signal, passes through the monitoring line 16. The second line CPL2 of the phase adjustment-coupler circuit 17 is inserted into the monitoring line 16.

In the duplexer module 11 having such a circuit configuration, the first line CPL1 and the second line CPL2 are coupled to each other in the phase adjustment-coupler circuit 17, and a portion of the electrical power of the transmission signal is output to the monitoring port MON. Furthermore, using the first line CPL1, the phase of the transmission signal is adjusted, and matching with the reception signal is coordinated. In the present preferred embodiment, the first line CPL doubles as a phase adjustment line on a transmission side, and hence, compared with the first preferred embodiment, it is possible to reduce the insertion loss of the phase adjustment circuit and it is also possible to promote the downsizing of a module size.

In addition, when the discrete component of the duplexer is mounted on the substrate, thereby configuring the duplexer module 11, the transmission filter Tx, the reception filter Rx, and the phase adjustment-coupler circuit 17 may also be embedded in the discrete component, or only the transmission filter Tx and the reception filter Rx may also be embedded. In addition, the transmission filter Tx and the reception filter Rx may also be mounted, as different discrete components, on the substrate.

Figure 3:
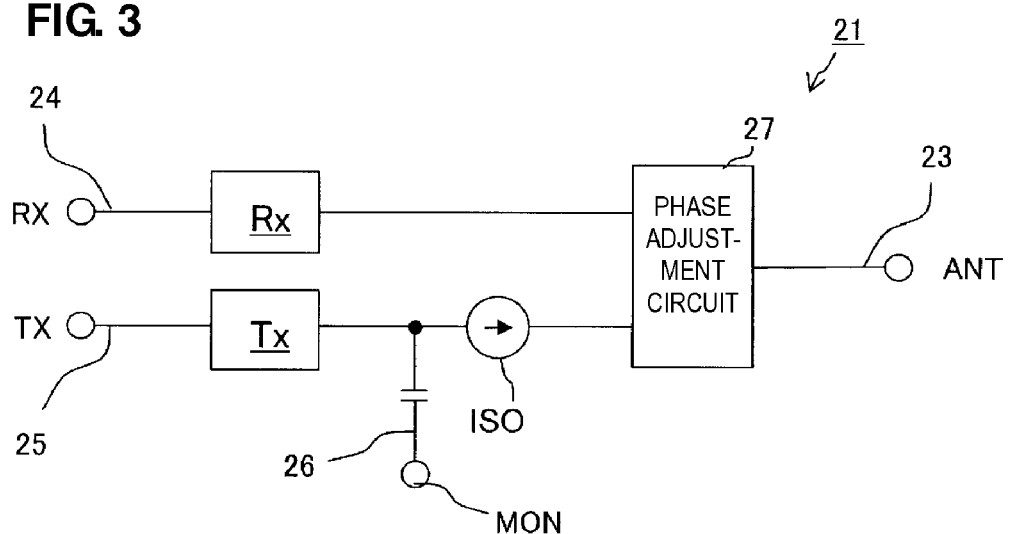
FIG. 3 is a diagram illustrating an example of a configuration of a duplexer module according to a third preferred embodiment of the present invention.

FIG. 3 is an equivalent circuit diagram illustrating an example of the configuration of a duplexer module according to a third preferred embodiment of the present invention.

A duplexer module 21 includes an antenna common line 23, a reception line 24, a transmission line 25, and a monitoring line 26. In addition, as circuit elements, the duplexer module 21 includes a transmission filter Tx, a reception filter Rx, an isolator ISO, and a phase adjustment circuit 27. The configuration of the equivalent circuit of the duplexer module 21 other than the configuration of the isolator ISO is preferably the same as that of the duplexer module 1 of the first preferred embodiment.

The antenna common line 23 is a line that connects the phase adjustment circuit 27 and the antenna port ANT to each other and through which an antenna common signal passes. The reception line 24 is a line that connects the phase adjustment circuit 27 and the reception port RX to each other and through which a reception signal passes, and the reception filter Rx is inserted into the reception line 24. The transmission line 25 is a line that connects the transmission port TX and the phase adjustment circuit 27 to each other and through which a transmission signal passes, and the transmission filter Tx and the isolator ISO are inserted into the transmission line 25. The monitoring line 26 is a line that connects a connection point between the transmission filter Tx and the isolator ISO in the transmission line 25 and the monitoring port MON to each other and through which a signal used to monitor the transmission signal passes, and a capacitor used to couple the monitoring port MON to the transmission line 25 is inserted into the monitoring line 26.

In the duplexer module 21 having such a circuit configuration, the isolator ISO that is an irreversible circuit transmits the transmission signal in only one direction in the same way as the coupler. In addition, owing to the capacitor inserted into the monitoring line 26, the monitoring line 26 is coupled to the transmission line 25, and a potion of the transmission signal is output to the monitoring port MON. Therefore, in the duplexer module 21, the same electrical action as that of the coupler CPL in the duplexer module 1 of the first preferred embodiment is obtained. Accordingly, it is possible to output a portion of the electrical power of the transmission signal subjected to the influence of an insertion loss due to the transmission filter Tx, from the monitoring port MON, and furthermore, it is possible to improve the receiving sensitivity of the duplexer module 21. In addition, in a case in which the isolator is used, even if the impedance of an antenna varies, the impedance of the transmission filter Tx is maintained at 50Ω, for example. Accordingly, it is possible to cause transmission characteristics to be stable, and it is also possible to cause the characteristics of a power amplifier connected to the transmission filter Tx to be stable.

In addition, also in the duplexer module 21, when the discrete component of the duplexer is mounted on the substrate, thereby configuring the duplexer module 21, the transmission filter Tx, the reception filter Rx, and the phase adjustment-coupler circuit 27 may also be embedded in the discrete component, or only the transmission filter Tx and the reception filter Rx may also be embedded. In addition, the transmission filter Tx and the reception filter Rx may also be mounted, as different discrete components, on the substrate.

Figure 4A:
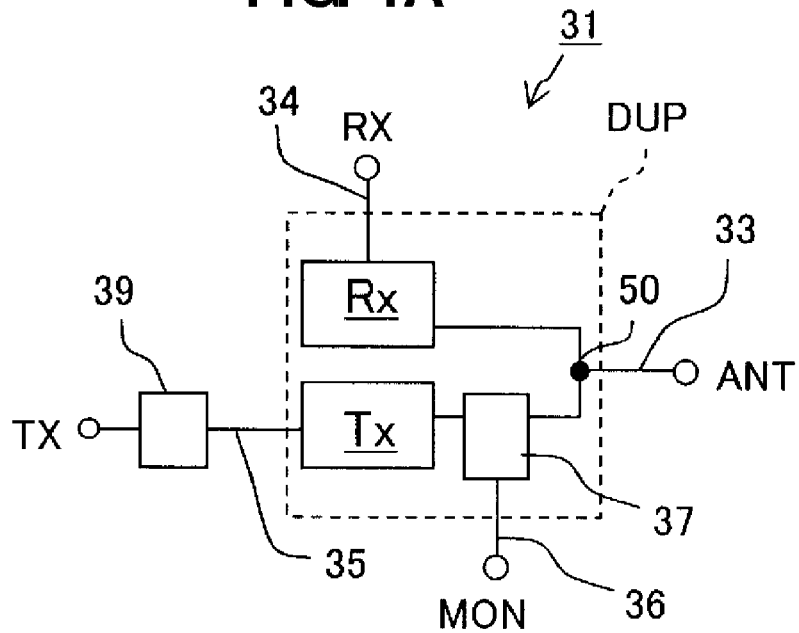
FIGS. 4A and 4B are diagrams illustrating an example of a configuration of a duplexer module according to a fourth preferred embodiment of the present invention.
Figure 4B:
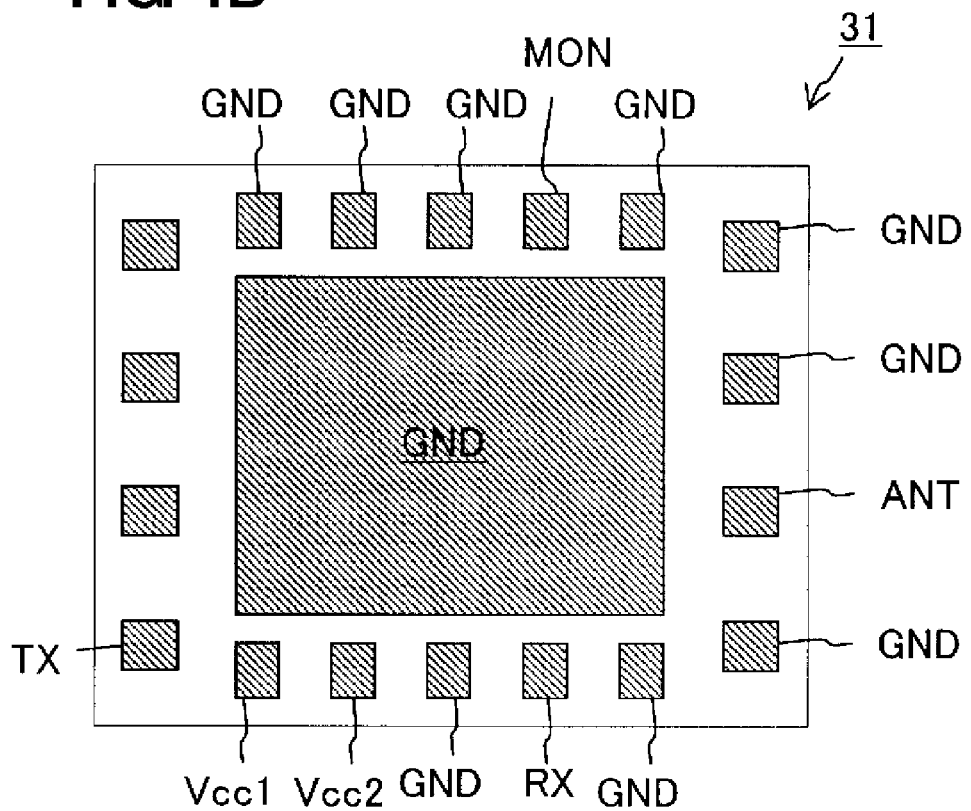

FIGS. 4A and 4B are diagrams illustrating an example of the configuration of a duplexer module according to a fourth preferred embodiment of the present invention. FIG. 4A is the schematic equivalent circuit diagram of the duplexer module, and FIG. 4B is the mounting surface diagram of the duplexer module.

A duplexer module 31 includes a duplexer DUP and an amplifying circuit unit 39, and includes an antenna common line 33, a reception line 34, a transmission line 35, a monitoring line 36, and a power-supply line 38. On the mounting surface of the duplexer module 31, mount electrodes are provided, each of which is used as one of a ground port GND, a transmission port TX, a reception port RX, an antenna port ANT, a monitoring port MON, and power supply ports Vcc1 and Vcc2 that are external connecting ports of the duplexer module 31.

The duplexer DUP preferably has the same circuit configuration as the circuit configuration adopted in the duplexer module 11 of the second preferred embodiment, and includes, as circuit elements, a transmission filter Tx, a reception filter Rx, and a phase adjustment-coupler circuit 37. An amplifying circuit unit 39 is configured using a power amplifier to amplify a transmission signal, or the like.

The antenna common line 33, the reception line 34, and the transmission line 35 are connected to one another using a connection portion 50. The antenna common line 33 connects the connection portion 50 and the antenna port ANT to each other, and an antenna common signal passes through the antenna common line 33. The reception line 34 connects the reception port RX and the connection portion 50 to each other through the reception filter Rx, and a reception signal passes through the reception line 34. The transmission line 35 connects the transmission port TX and the connection portion 50 to each other through the amplifying circuit unit 39, the transmission filter Tx, and the phase adjustment-coupler circuit 37, and a transmission signal passes through the transmission line 35. The monitoring line 36 is a line that connects the ground port GND and the monitoring port MON to each other and through which a signal used to monitor the transmission signal passes. In addition, the power supply ports Vcc1 and Vcc2 supply electric power to the amplifying circuit unit 39.

In the duplexer module 31 having such a circuit configuration, in the same way as the duplexer module 11 of the second preferred embodiment, it is possible to reduce the insertion loss of the phase adjustment circuit and it is also possible to promote the downsizing of a module size.

Here, a plurality of mount electrodes provided on the mounting surface of the duplexer module 31 are disposed along an outer edge of the mounting surface, and mount electrodes to be the transmission port TX, the reception port RX, the antenna port ANT, and the monitoring port MON are individually disposed along different sides. Furthermore, mount electrodes to define the ground ports GND are disposed between these mount electrode so as to be sandwiched. Accordingly, it is possible to prevent leakage of a signal between the transmission port TX, the reception port RX, the antenna port ANT, and the monitoring port MON, and it is possible to secure maximum isolation between the transmission signal and the reception signal. In particular, by disposing the monitoring port MON on a side different from sides on which the reception port RX and the antenna port ANT are disposed, it is possible to prevent a risk that an output signal is leaked from the monitoring port MON and hence the isolation between the transmission signal and the reception signal is lowered.

As described in the above-mentioned preferred embodiments, the monitoring element is disposed at a stage subsequent to the transmission filter of the duplexer in the transmission line, and hence preferred embodiments of the present invention may be suitably implemented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A duplexer module that performs conversion between a transmission signal and a reception signal and antenna common signals, the duplexer module comprising:
    a transmission line including a transmission filter allowing the transmission signal to pass therethrough;
    a reception line including a reception filter allowing the reception signal to pass therethrough;
    an antenna common line that is connected to the transmission line and the reception line through a connection portion and through which the antenna common signal passes; and
    a monitoring line through which a portion of electrical power of the transmission signal passes; wherein
    a monitoring element arranged to transmit the portion of the electrical power of the transmission signal to the monitoring line is located between the transmission filter and the connection portion.

2. The duplexer module according to claim 1, wherein a phase adjustment circuits arranged to adjust phases of the transmission signal and the reception signal is disposed between the connection portion and the transmission filter and between the connection portion and the reception filter.

3. The duplexer module according to claim 2 wherein the monitoring element includes a coupler that couples the monitoring line and the transmission line with each other.

4. The duplexer module according to claim 3, wherein the coupler includes first and second lines that are isolated from each other and coupled with each other, and the first line defines at least a portion of the phase adjustment circuit and the second line is included in the monitoring line and transmits the portion of the electrical power of the transmission signal to the monitoring line.

5. The duplexer module according to claim 1, wherein the monitoring element includes an isolator and a capacitor.

6. The duplexer module according to claim 4 further comprising:
    a substrate having a rectangular or substantially rectangular shape; and
    a plurality of mount electrodes disposed along an outer edge of a first main surface of the substrate; wherein a first mount electrode of the plurality of mount electrodes connected to one end portion of the transmission line and a second mount electrode of the plurality of mount electrodes connected to one end portion of the reception line are individually disposed along different sides of the outer edge.

7. The duplexer module according to claim 6, wherein a third mount electrode of the plurality of mount electrodes connected to one end portion of the monitoring line and the second mount electrode connected to the one end portion of the reception line or the first mount electrode connected to the one end portion of the transmission line are individually disposed along different sides of the outer edge.

8. The duplexer module according to claim 6, wherein the transmission filter, the reception filter, and the coupler are mounted on surface electrodes disposed on a second main surface facing the first main surface of the substrate; and
one of the surface electrodes on which one end portion of the first line of the coupler is mounted is connected to the connection portion through at least one of a pattern electrode and a via hole provided in the substrate.

9. The duplexer module according to claim 1, wherein the transmission filter and the reception filter are integrated into a discrete component, and include a terminal pair connected to the monitoring element.

\* \* \* \* \*